(12) United States Patent
Zhang et al.

(10) Patent No.: US 10,026,345 B2
(45) Date of Patent: Jul. 17, 2018

(54) DRIVING CIRCUIT OF DISPLAY PANEL AND THE QUALITY TEST METHOD THEREOF

(71) Applicant: Shenzhen China Star Optoelectronics Technology Co., Ltd., Shenzhen, Guangdong (CN)

(72) Inventors: Mengmeng Zhang, Guangdong (CN); Shishuai Huang, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 94 days.

(21) Appl. No.: 15/127,387

(22) PCT Filed: Aug. 17, 2016

(86) PCT No.: PCT/CN2016/095664
§ 371 (c)(1),
(2) Date: Sep. 19, 2016

(87) PCT Pub. No.: WO2017/143741
PCT Pub. Date: Aug. 31, 2017

(65) Prior Publication Data
US 2018/0068599 A1    Mar. 8, 2018

(30) Foreign Application Priority Data
Feb. 23, 2016   (CN) .......................... 2016 1 0099207

(51) Int. Cl.
*G01R 31/28*    (2006.01)
*G01R 31/26*    (2014.01)
*G09G 3/00*     (2006.01)

(52) U.S. Cl.
CPC ......... *G09G 3/006* (2013.01); *G01R 31/2621* (2013.01); *G01R 31/2642* (2013.01); *G01R 31/2855* (2013.01)

(58) Field of Classification Search
None
See application file for complete search history.

(56) References Cited

U.S. PATENT DOCUMENTS

| 8,754,836 | B2* | 6/2014 | Kim ..................... | G09G 3/3696 345/94 |
| 9,142,163 | B2* | 9/2015 | Jin ........................ | G09G 3/3266 |
| 9,171,494 | B2* | 10/2015 | Hwang ................ | G09G 3/3208 |
| 9,190,023 | B2* | 11/2015 | Kim ..................... | G09G 3/3696 |

(Continued)

FOREIGN PATENT DOCUMENTS

KR    1020060103590 A    10/2006

*Primary Examiner* — Jermele M Hollington
(74) *Attorney, Agent, or Firm* — Andrew C. Cheng

(57) ABSTRACT

The present disclosure discloses a driving circuit of display panel and the quality test method thereof. The driving circuit comprises a control circuit and a gate driving circuit. The control circuit comprises a first control output terminal used to output a first control signal and a second control output terminal used to output a second control signal. The gate driving circuit comprises a driving input terminal. In normal display mode, the driving input terminal receives the first control signal from the first control output terminal; in test mode, the driving input terminal receives the second control signal from the second control output terminal.

15 Claims, 5 Drawing Sheets

(56) References Cited

U.S. PATENT DOCUMENTS

| | | |
|---|---|---|
| 9,444,443 B2* | 9/2016 | Chung ................. G09G 3/3677 |
| 2008/0165101 A1 | 7/2008 | Kim et al. |
| 2012/0218244 A1* | 8/2012 | Park ..................... G09G 3/3648 |
| | | 345/211 |
| 2013/0155033 A1 | 6/2013 | Jin et al. |
| 2014/0111655 A1 | 4/2014 | Hwang |
| 2014/0125648 A1* | 5/2014 | Chung ................. G09G 3/3677 |
| | | 345/213 |
| 2016/0069947 A1 | 3/2016 | Wang et al. |

* cited by examiner

DRIVING CIRCUIT OF DISPLAY PANEL AND THE QUALITY TEST METHOD THEREOF

BACKGROUND OF THE INVENTION

1. Field of the Invention

The present disclosure relates to the fields of display technology, and in particular to a driving circuit of display panel and the quality test method thereof.

2. The Related Arts

The life time of the display panel is an important indicator for its quality. Life time test of the display panel is an important means for evaluation of the panel. Typically, the life time test method is to proceed the accelerated life time test. The thin film transistors (TFT) in the display panel are accelerated aging through a hot and humid environment, and then estimate the life time of the panel according to the acceleration factor. This test method usually requires hundreds to thousands of hours to complete.

In order to reduce the test time, the prior art utilizes an in-line accelerated aging test method, called DC stress. The test methods are as follows: accessing the scanning line (gate line) of the display panel to the turning-on voltage (VGH) before bonding, all data lines being always turned on, and then bonding the panel after dozens of hours of DC stress. After then, gradually decrease the VGH. When the grayscale brightness of the panel 255 is reduced to 60% of the initial luminance, the VGH reduced amplitude is called as VGH margin. The VGH margin is the indirect parameters characterizing the life time of the display panel.

This method of in-line accelerated aging test makes the TFT accelerated aged with near-normal panel display way, and the temperature and humidity are also close to the normal display. However, this method is proceeded before bonding panel, it should further bonding after aging, and then proceed normal lighting measurement, the procedure thereof is more complicated. Moreover, this test method needs in-line test, which will occupy the production line machine by dozens of hours, seriously affecting production efficiency and capacity.

SUMMARY OF THE INVENTION

A technical issue to be solved by the present disclosure is to provide a driving circuit of display panel and the quality test method thereof, which simplifies the testing process, improves test efficiency without compromising production efficiency and capacity.

To solve the above issue, a technical solution adopted by the present disclosure is to provide a driving circuit of display panel, comprising a control circuit and a gate driving circuit, the control circuit comprising a first control output terminal used to output a first control signal and a second control output terminal used to output a second control signal, the gate driving circuit comprising a driving input terminal; in normal display mode, the driving input terminal receiving the first control signal from the first control output terminal, so that the gate driving circuit drives a switching element on the display panel to turn on according to a first timing; in test mode, the driving input terminal receiving the second control signal from the second control output terminal, so that the gate driving circuit drives the switching element on the display panel to turn off according to a second timing; wherein, the proportion of the turning-on time of the switching element in the second timing is larger than that of the turning-on time of the switching element in the first timing; wherein, the display panel comprises multiple said switching elements arranged in an array, in the normal display mode, the gate driving circuit drives the switching elements to turn on by column or by row according to the first timing; in the test mode, the gate driving circuit drives all switching elements to turn off according to the second timing; wherein, the driving circuit further comprises a transfer element, the transfer element is connected with the first control output terminal and the driving input terminal in the normal display mode and is connected with the second control output terminal and the driving input terminal in the test mode.

Wherein, the driving input terminal is a turning-off voltage input terminal of the gate driving circuit, the first control output terminal is a turning-off voltage output terminal used to output a turning-off voltage, the second control output terminal is a turning-on voltage output terminal used to output a turning-on voltage; in the normal display mode, the turning-off voltage input terminal receives the turning-off voltage output from the turning-off voltage output terminal, so that the gate driving circuit periodically outputs the turning-on voltage and the turning-off voltage; in the test mode, the turning-off voltage output terminal receives the turning-on voltage output from the turning-on voltage output terminal, so that the gate driving circuit continuously outputs the turning-on voltage.

Wherein, the driving input terminal is an overall turning-on input terminal of the gate driving circuit, the first control output terminal is an overall turning-on output terminal used to output an overall control signal; in the normal display mode, the overall turning-on input terminal receives the overall control signal output from the overall turning-on output terminal, so that the gate driving circuit periodically outputs the turning-on voltage and the turning-off voltage when the overall control signal is at a first level, and the gate driving circuit continuously outputs the turning-on voltage when the overall turning-on output terminal is at a second level, the second control output terminal is a voltage output terminal continuously outputting the second level; in the test mode, the overall turning-on input terminal receives the second level from the voltage output terminal, so that the gate driving circuit continuously outputs the turning-on voltage.

Wherein, the transfer element is a zero resistance element, two ends of the zero resistance element are respectively connected to the first control output terminal and the driving input terminal in the normal display mode and connected to the second control output terminal and the driving input terminal in the test mode.

Wherein, the transfer element is a single port double throw element, the single port double throw element comprises a movable end, a first fixed end and a second fixed end, wherein, the movable end is connected to the driving input terminal, the first fixed end is connected to the first control output terminal, and the second fixed end is connected to the second control output terminal; in the normal display mode, the movable end is connected to the first fixed end, and in the test mode, the movable end is connected to the second fixed end.

Wherein, the transfer element comprises a first switch and a second switch, two ends of the first switch are respectively connected to the first control output terminal and the driving input terminal, two ends of the second switch are respectively connected to the second control output terminal and the driving input terminal; in the normal display mode, the first switch is turned on, the second switch is turned off, and in the test mode, the first switch is turned off, the second switch is turned on.

To solve the above issue, another technical solution adopted by the present disclosure is to provide a driving circuit of display panel, comprising a control circuit and a gate driving circuit, the control circuit comprising a first control output terminal used to output a first control signal and a second control output terminal used to output a second control signal, the gate driving circuit comprising a driving input terminal; in normal display mode, the driving input terminal receiving the first control signal from the first control output terminal, so that the gate driving circuit drives a switching element on the display panel to turn on according to a first timing; in test mode, the driving input terminal receiving the second control signal from the second control output terminal, so that the gate driving circuit drives the switching element on the display panel to turn off according to a second timing; wherein, the proportion of the turning-on time of the switching element in the second timing is larger than that of the turning-on time of the switching element in the first timing.

Wherein, the display panel comprises multiple said switching elements arranged in an array, in the normal display mode, the gate driving circuit drives the switching elements to turn on by column or by row according to the first timing; in the test mode, the gate driving circuit drives all switching elements to turn off according to the second timing.

Wherein, the driving input terminal is a turning-off voltage input terminal of the gate driving circuit, the first control output terminal is a turning-off voltage output terminal used to output a turning-off voltage, the second control output terminal is a turning-on voltage output terminal used to output a turning-on voltage; in the normal display mode, the turning-off voltage input terminal receives the turning-off voltage output from the turning-off voltage output terminal, so that the gate driving circuit periodically outputs the turning-on voltage and the turning-off voltage; in the test mode, the turning-off voltage output terminal receives the turning-on voltage output from the turning-on voltage output terminal, so that the gate driving circuit continuously outputs the turning-on voltage.

Wherein, the driving circuit further comprises a transfer element, the transfer element is connected with the first control output terminal and the driving input terminal in the normal display mode and is connected with the second control output terminal and the driving input terminal in the test mode.

Wherein, the transfer element is a zero resistance element, two ends of the zero resistance element are respectively connected to the first control output terminal and the driving input terminal in the normal display mode and connected to the second control output terminal and the driving input terminal in the test mode.

Wherein, the transfer element is a single port double throw element, the single port double throw element comprises a movable end, a first fixed end and a second fixed end, wherein, the movable end is connected to the driving input terminal, the first fixed end is connected to the first control output terminal, and the second fixed end is connected to the second control output terminal; in the normal display mode, the movable end is connected to the first fixed end, and in the test mode, the movable end is connected to the second fixed end.

Wherein, transfer element comprises a first switch and a second switch, two ends of the first switch are respectively connected to the first control output terminal and the driving input terminal, two ends of the second switch are respectively connected to the second control output terminal and the driving input terminal; in the normal display mode, the first switch is turned on, the second switch is turned off, and in the test mode, the first switch is turned off, the second switch is turned on.

To solve the above issue, another technical solution adopted by the present disclosure is to provide a quality test method of display panel, comprising: determining whether the display panel is in test mode or in normal display mode; if in normal display mode, inputting a first control signal to a driving input terminal of a gate driving circuit, so that the gate driving circuit drives a switching element on the display panel to turn on according to a first timing; if in test mode, inputting a second control signal to the driving input terminal of the gate driving circuit, so that the gate driving circuit drives the switching element on the display panel to turn on according to a second timing; wherein, the proportion of the turning-on time of the switching element in the second timing is larger than that of the turning-on time of the switching element in the first timing.

Wherein, the display panel comprises multiple said switching elements arranged in an array, in the normal display mode, the gate driving circuit drives the switching elements to turn on by column or by row according to the first timing; in the test mode, the gate driving circuit drives all switching elements to turn off according to the second timing.

The benefits of the present disclosure are as follows. The driving circuit of display panel and the quality test method thereof according to the present disclosure can be switched between the test mode and the normal display mode by changing the input signal of a specific input terminal of the gate driving circuit. It can proceed off-line quality test after assembling the module, which simplifies the testing process, improves test efficiency without compromising production efficiency and capacity.

DETAILED DESCRIPTION OF THE PREFERRED EMBODIMENTS

The following accompanying the drawings and the embodiments of the present invention will be described in detail.

Figure 1:
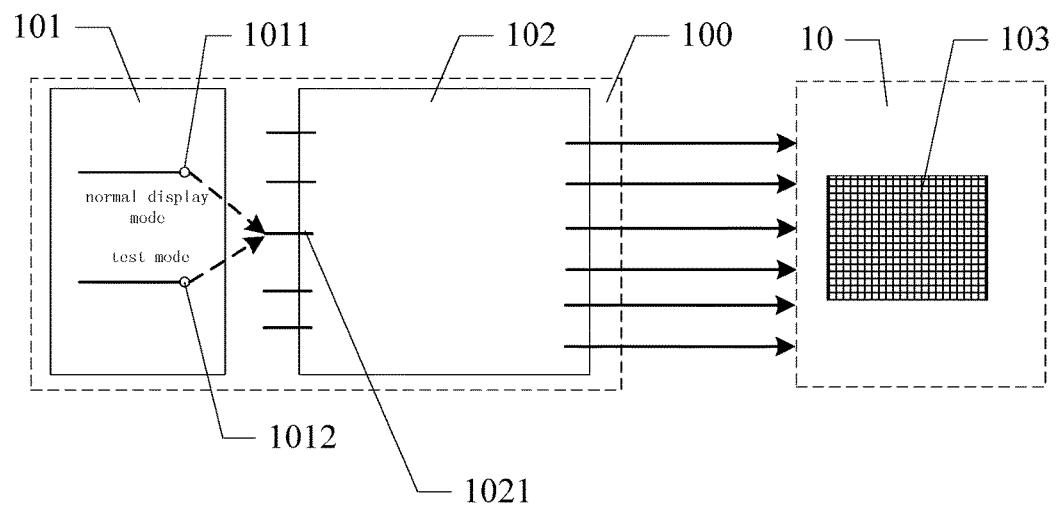
FIG. 1 is a schematic view illustrating the structure of the driving circuit according to the first embodiment of the present disclosure.

Referring to FIG. 1, FIG. 1 is a schematic view illustrating the structure of the driving circuit according to the first embodiment of the present disclosure. As shown in FIG. 1, the driving circuit 100 comprises a control circuit 101 and a gate driving circuit 102. The control circuit 101 comprises a first control output terminal 1011 used to output a first control signal and a second control output terminal 1012 used to output a second control signal. The gate driving circuit 102 comprises a driving input terminal 1021. In normal display mode, the driving input terminal 1021 receives the first control signal from the first control output terminal 1011, so that the gate driving circuit 102 drives a switching element 103 on the display panel 10 to turn on according to a first timing. In test mode, the driving input terminal 1021 receives the second control signal from the second control output terminal 1012, so that the gate driving circuit 102 drives the switching element 103 on the display panel 10 to turn off according to a second timing. Wherein, the proportion of the turning-on time of the switching element 103 in the second timing is larger than that of the turning-on time of the switching element 103 in the first timing. That is to say, it correspondingly decreases the proportion of the turning-off time through increasing the proportion of turning-on time in the second timing, so that the proportion of the turning-on time of the switching element 103 in the second timing is larger than that of the turning-on time of the switching element 103 in the first timing.

Figure 2A:
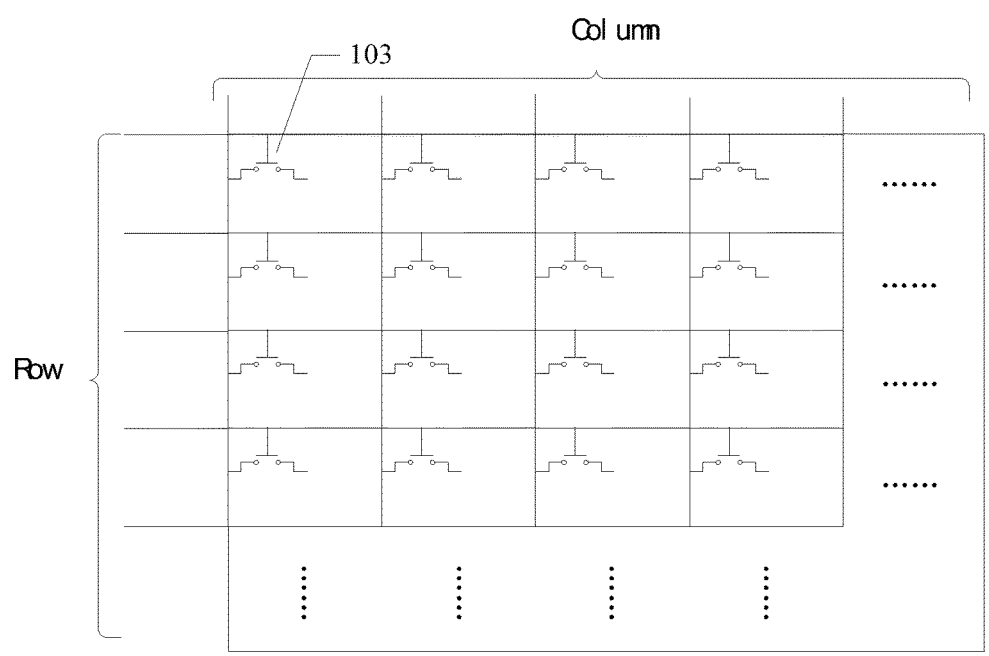
FIG. 2a is a schematic view illustrating the structure of multiple switching elements in the display panel arranged in array.

Typically, the display panel comprises multiple switching elements 103 arranged in an array, as shown in FIG. 2a, it is a schematic view illustrating the structure of multiple switching elements in the display panel arranged in array. In the normal display mode, the gate driving circuit 102 drives the switching elements 103 to turn on by column or by row according to the first timing; in the test mode, the gate driving circuit 102 drives all switching elements 103 to turn off according to the second timing.

Figure 2B:
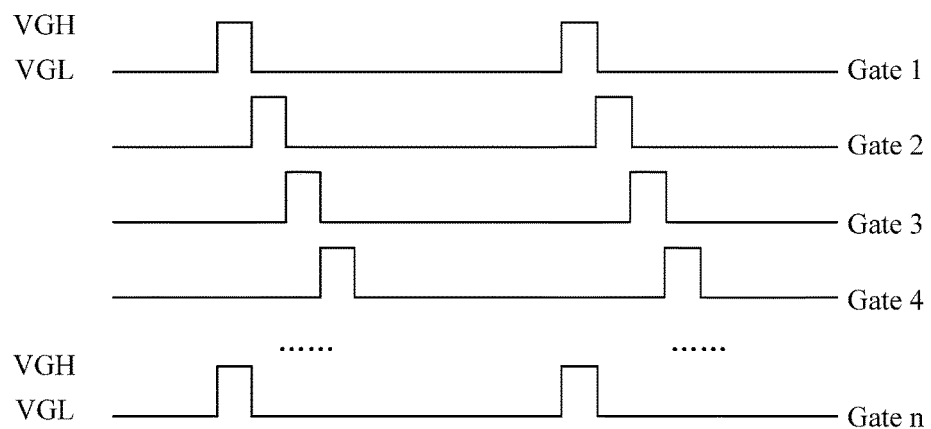
FIG. 2b is a first timing diagram driven and output from the driving circuit according to the present disclosure.
Figure 2C:
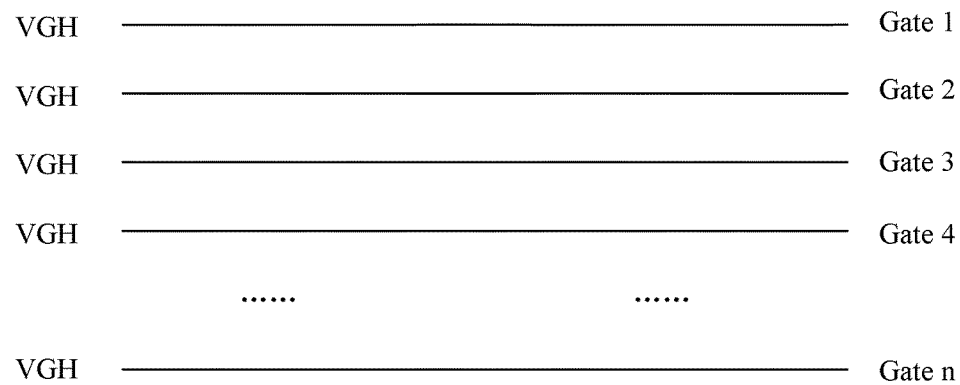
FIG. 2c is a second timing diagram driven and output from the driving circuit according to the present disclosure.

The amount of the switching elements on the display panel is related to the resolution of the display panel. For example, if the resolution of the display panel is m×n, it indicates that the display panel is composed of m columns multiplying by n rows of pixels. Each pixel comprises at least one switching element 103. When the display panel displays normally, if turn on the m×n switching elements row by row, as shown in FIG. 2b, which is a first timing diagram driven and output from the driving circuit according to the present disclosure, wherein, VGH represents the turning-on voltage of the switching elements 103, VGL represents the turning-off voltage of the switching elements 103. When testing the display panel, the output voltage of the gate driving circuit 102 is turning-on voltage VGH, and the second timing drives all arrays composed of the switching elements 103 to turn on, as shown in FIG. 2c, which is a second timing diagram driven and output from the driving circuit according to the present disclosure.

It should be noted that, as shown in FIG. 2b, assuming the display panel refresh rate is 60 Hz, the time resolution is 1920×1080, that is, there are 60 frames per second, and then the appearance time per frame is 1/60 s, that is, 16.67 μs, and the resolution is 1920×1080. When the display panel displays normally, if turning on the switching element 103 row by row, the turning-on time of each row is 16.67/1080 s, that is, 15.43 μs; however, when the display panel is in the test mode, the turning-on voltage is always turned on. If the turn-on voltage is always turned on 1 h, which is equivalent to 1080 h of the normal display state, thus the lighting method of the turning-on voltage always turned on is equivalent to 1080 times of acceleration factor of the lighting method in the normal display mode, which can greatly increase the test efficiency.

Figure 3:
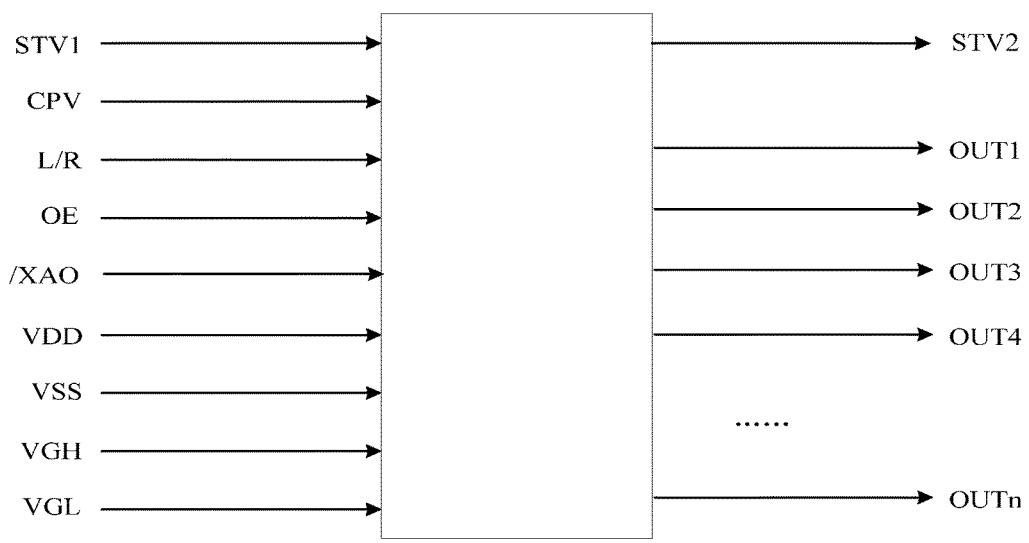
FIG. 3 is a schematic view illustrating the structure of each common input and output channel of the gate driving circuit according to the present disclosure.

The gate driving circuit 102 can be a gate driving circuit attached to the display panel 10, which can also be a GOA driving circuit formed on the display panel 10 in GOA method. It is well known that the conventional gate driving circuit has a plurality of input and output channels, as shown in FIG. 3, which is a schematic view illustrating the structure of each common input and output channel of the gate driving circuit 102. In the present embodiment, the control circuit 101 changes the output signal of the output channel through controlling the input signal of each input channel of the gate driving circuit 102.

Therefore, the present disclosure chooses a specific input channel of the gate driving circuit 102 as the driving input terminal 1021, it can control the display panel 10 to be switched between the normal display mode and the test mode by changing the input signal of the input channel.

For example, the gate driving circuit 102 usually comprises a turning-off voltage input terminal VGL and a turning-on voltage input terminal VGH. Wherein, in normal display mode, the turning-off voltage input terminal VGL and the turning-on voltage input terminal VGH respectively receives the turning-off voltage and the turning-on voltage from the control circuit 101, and proceed the shift operation through a shift register group (not shown) cascaded inside the gate driving circuit 102, so that each output terminal OUT1-OUTn periodically outputs the turning-on voltage and the turning-off voltage, which further controls the switching element 103 of the display panel 10 to turn on by row or by column.

In a preferred embodiment of the present disclosure, the turning-off voltage input terminal VGL of the gate driving circuit 102 acts as the driving input terminal 1021 in the present disclosure, the turning-off voltage output terminal used to output the turning-off voltage acts as the first control output terminal 1011, and the turning-on voltage output terminal used to output the turning-on voltage acts as the second control output terminal 1012.

In normal display mode, the turning-off voltage input terminal VGL is connected with the first control output terminal 1011, the turning-on voltage input terminal VGH is connected with the second control output terminal 1012. That is, it applies the turning-on voltage and the turning-off voltage on the turning-on voltage input terminal VGH and the turning-off voltage input terminal VGL, so that the output terminals OUT1-OUTn periodically output the turning-on voltage and the turning-off voltage. In test mode, the turning-off voltage input terminal VGL is disconnected with the first control output terminal 1011 and connected with the second control output terminal 1012. That is, it simultaneously applies the turning-on voltage VGH on the turning-on voltage input terminal VGH and the turning-off voltage input terminal VGL, so that the output terminals OUT1-OUTn continuously output the turning-on voltage. Furthermore, the gate driving circuit 102 typically comprises an overall turning-on input terminal \XAO. In normal display mode, the overall turning-on input terminal \XAO is used to receive an overall control signal. The function thereof is to control all switching elements of the display panel 10 to turn on after finishing display, which further accelerates the rapid discharge of the display panel 10.

In another preferred embodiment of the present disclosure, the overall turning-on input terminal \XAO of the gate driving circuit 102 acts as the driving input terminal 1021 in the present disclosure, and the overall turning-on output terminal used to output the overall control signal acts as the first control output terminal 1011. In normal display mode, the overall turning-on input terminal \XAO is used to receive the overall control signal output from the first control output terminal 1011, so that the gate driving circuit 102 periodically outputs the turning-on voltage and the turning-off voltage when the overall control signal is at a first level, and the gate driving circuit 102 continuously outputs the turning-on voltage when the overall control signal is at a second level. Furthermore, the voltage output terminal continuously outputting the second level acts as the second control output terminal 1012. In the test mode, the overall turning-on input terminal \XAO receives the second level from the second control output terminal 1012, so that the gate driving circuit 102 continuously outputs the turning-on voltage.

Figure 4:
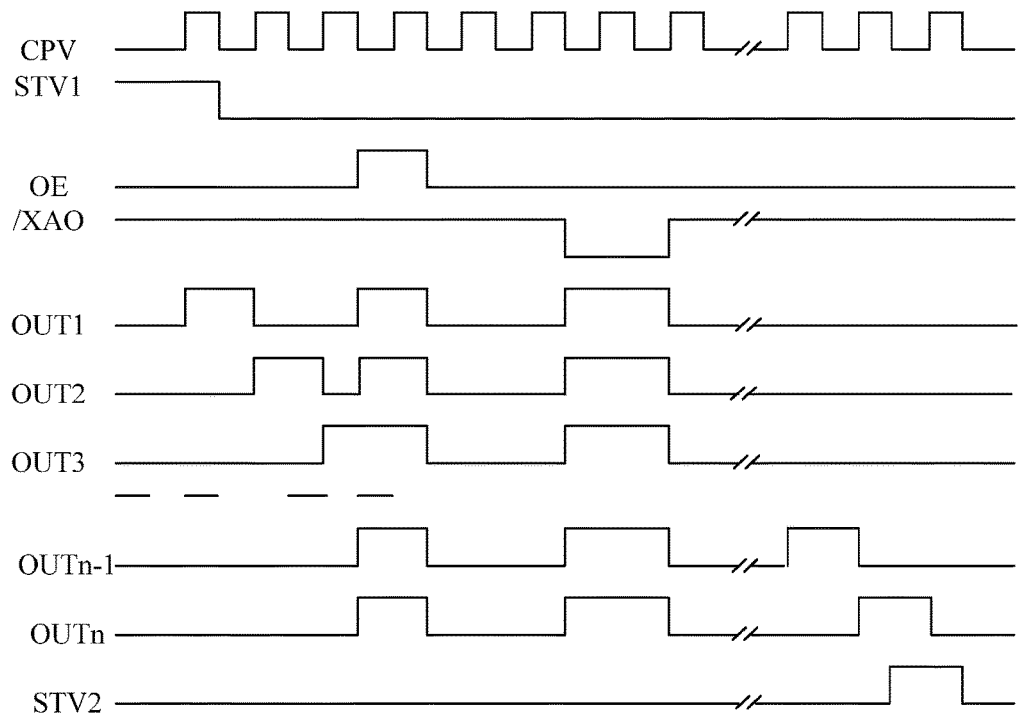
FIG. 4 is a schematic view illustrating the structure of each output channel of the gate driving circuit outputs turning-on voltage when the overall turning-on input terminal \XAO of the gate driving circuit is at low level according to the present disclosure.

In the present embodiment, the priority of the \XAO input signal of the overall turning-on input terminal \XAO of the gate driving circuit 102 is higher than the OE input signal. When the \XAO input signal is at high level (such as 3V), the gate driving circuit 102 periodically outputs the turning-on voltage and the turning-off voltage; when the \XAO input signal is at low level (such as 0V), the gate driving circuit 102 continuously outputs the turning-on voltage, that is, all OUT only output the VGH voltage. As shown in FIG. 4, it is a schematic view illustrating the structure of each output channel of the gate driving circuit outputs turning-on voltage when the overall turning-on input terminal \XAO of the gate driving circuit is at low level according to the present disclosure.

Figure 5:
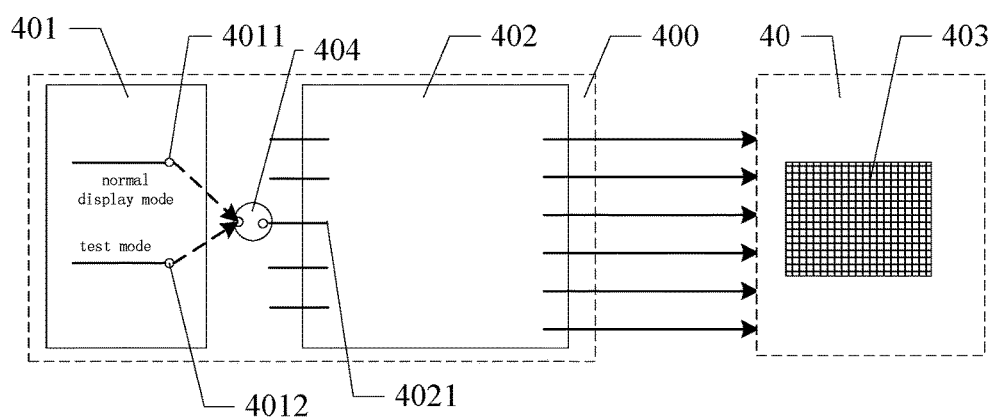
FIG. 5 is a schematic view illustrating the structure of the driving circuit according to the second embodiment of the present disclosure.

Referring to FIG. 5, FIG. 5 is a schematic view illustrating the structure of the driving circuit according to the second embodiment of the present disclosure.

In the present embodiment, the driving circuit 400 comprises a control circuit 401 and a gate driving circuit 402 similar to the FIG. 1. Moreover, the driving circuit 400 further comprises a transfer element 404. The transfer element 404 is connected with the first control output terminal 4011 and the driving input terminal 4021 in the normal display mode, so that the driving input terminal 4021 receives the first control signal from the first control output terminal 4011, which further drives the switching element 403 on the display panel 40 in the first timing. In the test mode, the transfer element 404 is connected with the second control output terminal 4012 and the driving input terminal 4021, so that the driving input terminal 4021 receives the second control signal from the second control output terminal 4012, which further drives the switching element 403 on the display panel 40 in the second timing.

Figure 6:
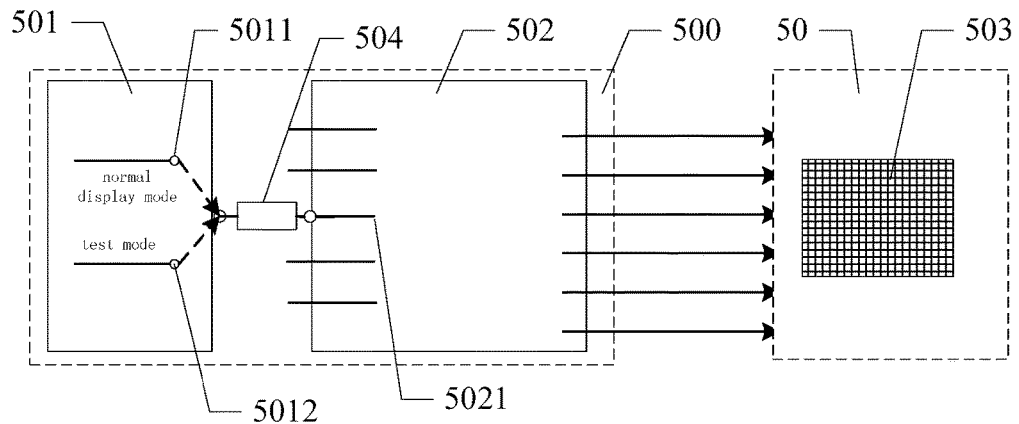
FIG. 6 is a schematic view illustrating the structure of the driving circuit according to the third embodiment of the present disclosure.

Referring to FIG. 6, FIG. 6 is a schematic view illustrating the structure of the driving circuit according to the third embodiment of the present disclosure.

In the present embodiment, the driving circuit 500 comprises a control circuit 501, a gate driving circuit 502, and a transfer element 504 similar to the FIG. 5. Wherein, the transfer element 504 is a zero resistance element 504. In the normal display mode, two ends of the zero resistance element 504 are respectively connected to the first control output terminal 5011 and the driving input terminal 5021, so that the driving input terminal 5021 receives the first control signal from the first control output terminal 5011, which further drives the switching element 503 on the display panel 50 in the first timing. In the test mode, the zero resistance element 504 is connected to the second control output terminal 5012 and the driving input terminal 5021, so that the driving input terminal 5021 receives the second control signal from the second control output terminal 5012, which further drives the switching element 503 on the display panel 50 in the second timing. It should be noted that the zero resistance element 504 acts as a jumper in the present embodiment, which does not affect the overall effect of the circuit.

Figure 7:
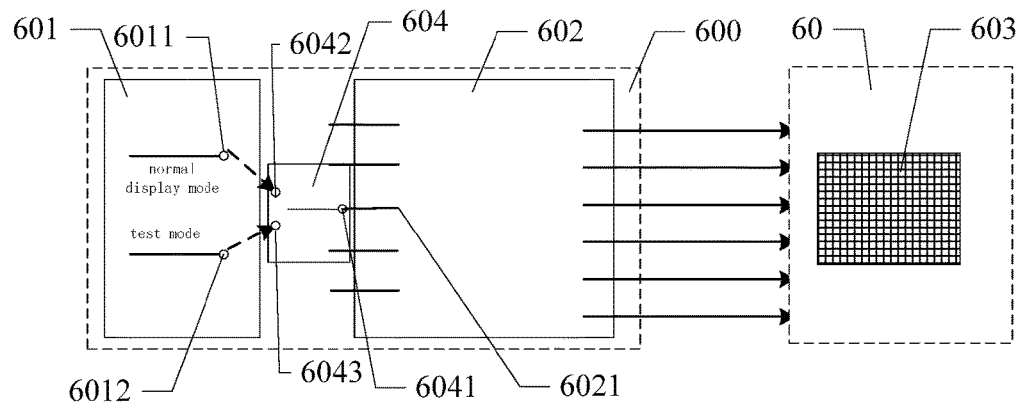
FIG. 7 is a schematic view illustrating the structure of the driving circuit according to the fourth embodiment of the present disclosure.

Referring to FIG. 7, FIG. 7 is a schematic view illustrating the structure of the driving circuit according to the fourth embodiment of the present disclosure.

In the present embodiment, the driving circuit 600 comprises a control circuit 601, a gate driving circuit 602, and a transfer element 604 similar to the FIG. 5. Wherein, the transfer element 604 is a single port double throw element 604. The single port double throw element 604 comprises a movable end 6041, a first fixed end 6042 and a second fixed end 6043. The movable end 6041 is connected to the driving input terminal 6021, the first fixed end 6042 is connected to the first control output terminal 6011, and the second fixed end 6043 is connected to the second control output terminal 6012. In the normal display mode, the movable end 6041 of the single port double throw element 604 is connected to the first fixed end 6042, so that the driving input terminal 6021 receives the first control signal from the first control output terminal 6011, which further drives the switching element 603 on the display panel 60 in the first timing. In the test mode, the movable end 6041 of the single port double throw element 604 is connected to the second fixed end 6043, so that the driving input terminal 6021 receives the second control signal from the second control output terminal 6012, which further drives the switching element 603 on the display panel 60 in the second timing.

Figure 8:
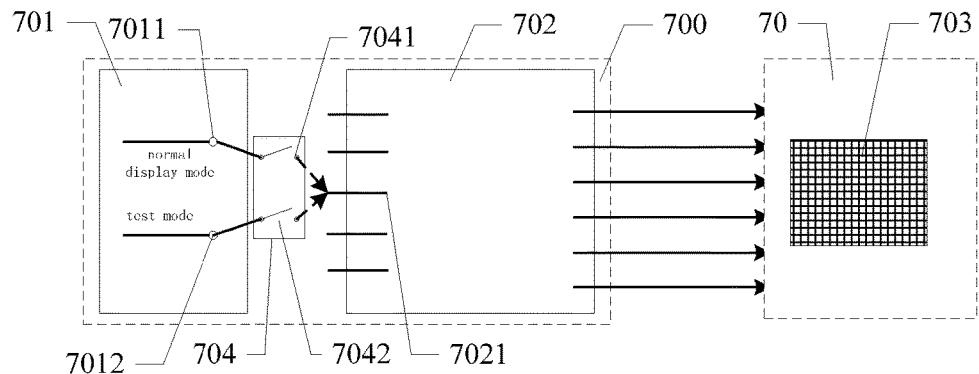
FIG. 8 is a schematic view illustrating the structure of the driving circuit according to the fifth embodiment of the present disclosure.

Referring to FIG. 8, FIG. 8 is a schematic view illustrating the structure of the driving circuit according to the fifth embodiment of the present disclosure.

In the present embodiment, the driving circuit 700 comprises a control circuit 701, a gate driving circuit 702, and a transfer element 704 similar to the FIG. 5. Wherein, the transfer element 704 comprises a first switch 7041 and a second switch 7042. Two ends of the first switch 7041 are respectively connected to the first control output terminal 7011 and the driving input terminal 7021, two ends of the second switch 7042 are respectively connected to the second control output terminal 7012 and the driving input terminal 7021. In the normal display mode, the first switch 7041 is turned on, the second switch 7042 is turned off, so that the driving input terminal 7021 receives the first control signal from the first control output terminal 7011, which further drives the switching element 703 on the display panel 70 in the first timing. In the test mode, the first switch 7041 is turned off, the second switch 7042 is turned on, so that the driving input terminal 7021 receives the second control signal from the second control output terminal 7012, which further drives the switching element 703 on the display panel 70 in the second timing.

From the above embodiment, it can be known that the driving circuit according to the present disclosure can be switched between the test mode and the normal display mode by changing the input signal of a specific input terminal of the gate driving circuit. It can proceed off-line quality test after assembling the module, which simplifies the testing process, improves test efficiency without compromising production efficiency and capacity.

Figure 9:
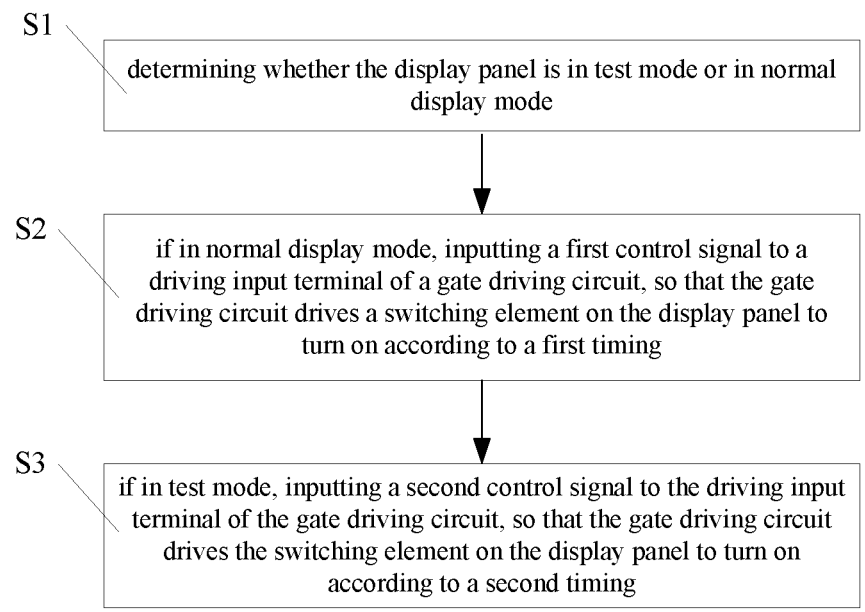
FIG. 9 is a flow chart of the quality test method of the display panel according to the present disclosure.

The present disclosure further provides a quality test method of display panel. FIG. 9 is a flow chart of the quality test method of the display panel according to the present disclosure. As shown in FIG. 9, the quality test method specifically comprises the following steps (the labels referring to FIG. 1):

S1: determining whether the display panel 10 is in test mode or in normal display mode;

S2: if in normal display mode, inputting a first control signal to a driving input terminal 1021 of a gate driving circuit 102, so that the gate driving circuit 102 drives a switching element 103 on the display panel 10 to turn on according to a first timing;

S3: if in test mode, inputting a second control signal to the driving input terminal 1021 of the gate driving circuit 102, so that the gate driving circuit 102 drives the switching element 103 on the display panel 10 to turn on according to a second timing;

Wherein, the proportion of the turning-on time of the switching element 103 in the second timing is larger than that of the turning-on time of the switching element 103 in the first timing.

Wherein, the display panel 10 comprises multiple said switching elements 103 arranged in an array. In the normal display mode, the first control output terminal 1011 is connected with the driving input terminal 1021, so that the driving input terminal 1021 receives the first control signal from the first control output terminal 1011, the gate driving circuit 1021 drives the switching elements 103 to turn on by column or by row according to the first timing. In the test mode, the second control output terminal 1012 is connected with the driving input terminal 1021, so that the driving input terminal 1021 receives the second control signal from the second control output terminal 1012, the gate driving circuit 1021 drives all switching elements 103 to turn off according to the second timing.

It should be noted that the quality test method according to the present embodiment can be proceeded after assembling the module, which simplifies the testing process. It will not take up the in-line production time, so it will not compromises the production capacity.

The embodiments of the present disclosure have been described above, but the scope of the present disclosure is not limited. Any equivalent structures or equivalent transformation processes using the contents of the present specification and drawings, or directly or indirectly used in other related areas of technology are similarly included within the scope of patent protection of the present invention.

What is claimed is:

1. A driving circuit of display panel, comprising a control circuit and a gate driving circuit, the control circuit comprising a first control output terminal used to output a first control signal and a second control output terminal used to output a second control signal, the gate driving circuit comprising a driving input terminal; in normal display mode, the driving input terminal receiving the first control signal from the first control output terminal, so that the gate driving circuit drives a switching element on the display panel to turn on according to a first timing; in test mode, the driving input terminal receiving the second control signal from the second control output terminal, so that the gate driving circuit drives the switching element on the display panel to turn off according to a second timing;

wherein the proportion of the turning-on time of the switching element in the second timing is larger than that of the turning-on time of the switching element in the first timing;

wherein the display panel comprises multiple said switching elements arranged in an array, in the normal display mode, the gate driving circuit drives the switching elements to turn on by column or by row according to the first timing; in the test mode, the gate driving circuit drives all switching elements to turn off according to the second timing; and wherein the driving circuit further comprises a transfer element, the transfer element is connected with the first control output terminal and the driving input terminal in the normal display mode and is connected with the second control output terminal and the driving input terminal in the test mode such that in the normal display mode, the transfer element receives the first control signal from the first control output terminal and feeds the first control signal to the driving input terminal; and in the test mode, the transfer element receives the second control signal from the second control output terminal and feeds the second control signal to the driving input terminal.

2. The driving circuit as claimed in claim 1, wherein the driving input terminal is a turning-off voltage input terminal of the gate driving circuit, the first control output terminal is a turning-off voltage output terminal used to output a turning-off voltage, the second control output terminal is a turning-on voltage output terminal used to output a turning-on voltage; in the normal display mode, the turning-off voltage input terminal receives the turning-off voltage output from the turning-off voltage output terminal, so that the gate driving circuit periodically outputs the turning-on voltage and the turning-off voltage; in the test mode, the turning-off voltage output terminal receives the turning-on voltage output from the turning-on voltage output terminal, so that the gate driving circuit continuously outputs the turning-on voltage.

3. The driving circuit as claimed in claim 1, wherein the driving input terminal is an overall turning-on input terminal of the gate driving circuit, the first control output terminal is an overall turning-on output terminal used to output an overall control signal; in the normal display mode, the overall turning-on input terminal receives the overall control signal output from the overall turning-on output terminal, so that the gate driving circuit periodically outputs the turning-on voltage and the turning-off voltage when the overall control signal is at a first level, and the gate driving circuit continuously outputs the turning-on voltage when the overall turning-on output terminal is at a second level, the second control output terminal is a voltage output terminal continuously outputting the second level; in the test mode, the overall turning-on input terminal receives the second level from the voltage output terminal, so that the gate driving circuit continuously outputs the turning-on voltage.

4. The driving circuit as claimed in claim 1, wherein the transfer element is a zero resistance element, two ends of the zero resistance element are respectively connected to the first control output terminal and the driving input terminal in the normal display mode and connected to the second control output terminal and the driving input terminal in the test mode.

5. The driving circuit as claimed in claim 1, wherein the transfer element is a single port double throw element, the single port double throw element comprises a movable end, a first fixed end and a second fixed end, wherein, the movable end is connected to the driving input terminal, the first fixed end is connected to the first control output terminal, and the second fixed end is connected to the second control output terminal; in the normal display mode, the movable end is connected to the first fixed end, and in the test mode, the movable end is connected to the second fixed end.

6. The driving circuit as claimed in claim 1, wherein the transfer element comprises a first switch and a second switch, two ends of the first switch are respectively connected to the first control output terminal and the driving input terminal, two ends of the second switch are respectively connected to the second control output terminal and the driving input terminal; in the normal display mode, the first switch is turned on, the second switch is turned off, and in the test mode, the first switch is turned off, the second switch is turned on.

7. A driving circuit of display panel, comprising a control circuit and a gate driving circuit, the control circuit comprising a first control output terminal used to output a first control signal and a second control output terminal used to output a second control signal, the gate driving circuit comprising a driving input terminal; in normal display mode, the driving input terminal receiving the first control signal from the first control output terminal, so that the gate driving circuit drives a switching element on the display panel to turn on according to a first timing; in test mode, the driving input terminal receiving the second control signal from the second control output terminal, so that the gate driving circuit drives the switching element on the display panel to turn off according to a second timing; wherein the proportion of the turning-on time of the switching element in the second timing is larger than that of the turning-on time of the switching element in the first timing;

wherein the driving circuit further comprises a transfer element, which is connected with the first control output terminal and the driving input terminal in the normal display mode and is connected with the second control output terminal and the driving input terminal in the test mode such that in the normal display mode, the transfer element receives the first control signal from the first control output terminal and feeds the first control signal to the driving input terminal; and in the test mode, the transfer element receives the second control signal from the second control output terminal and feeds the second control signal to the driving input terminal.

8. The driving circuit as claimed in claim 7, wherein the display panel comprises multiple said switching elements arranged in an array, in the normal display mode, the gate driving circuit drives the switching elements to turn on by column or by row according to the first timing; in the test mode, the gate driving circuit drives all switching elements to turn off according to the second timing.

9. The driving circuit as claimed in claim 7, wherein the driving input terminal is a turning-off voltage input terminal of the gate driving circuit, the first control output terminal is a turning-off voltage output terminal used to output a turning-off voltage, the second control output terminal is a turning-on voltage output terminal used to output a turning-on voltage; in the normal display mode, the turning-off voltage input terminal receives the turning-off voltage output from the turning-off voltage output terminal, so that the gate driving circuit periodically outputs the turning-on voltage and the turning-off voltage; in the test mode, the turning-off voltage output terminal receives the turning-on voltage output from the turning-on voltage output terminal, so that the gate driving circuit continuously outputs the turning-on voltage.

10. The driving circuit as claimed in claim 7, wherein the driving input terminal is an overall turning-on input terminal of the gate driving circuit, the first control output terminal is an overall turning-on output terminal used to output an overall control signal; in the normal display mode, the overall turning-on input terminal receives the overall control signal output from the overall turning-on output terminal, so that the gate driving circuit periodically outputs the turning-on voltage and the turning-off voltage when the overall control signal is at a first level, and the gate driving circuit continuously outputs the turning-on voltage when the overall turning-on output terminal is at a second level, the second control output terminal is a voltage output terminal continuously outputting the second level; in the test mode, the overall turning-on input terminal receives the second level from the voltage output terminal, so that the gate driving circuit continuously outputs the turning-on voltage.

11. The driving circuit as claimed in claim 7, wherein the transfer element is a zero resistance element, two ends of the zero resistance element are respectively connected to the first control output terminal and the driving input terminal in the normal display mode and connected to the second control output terminal and the driving input terminal in the test mode.

12. The driving circuit as claimed in claim 7, wherein the transfer element is a single port double throw element, the single port double throw element comprises a movable end, a first fixed end and a second fixed end, wherein, the movable end is connected to the driving input terminal, the first fixed end is connected to the first control output terminal, and the second fixed end is connected to the second control output terminal; in the normal display mode, the movable end is connected to the first fixed end, and in the test mode, the movable end is connected to the second fixed end.

13. The driving circuit as claimed in claim 7, wherein transfer element comprises a first switch and a second switch, two ends of the first switch are respectively connected to the first control output terminal and the driving input terminal, two ends of the second switch are respectively connected to the second control output terminal and the driving input terminal; in the normal display mode, the first switch is turned on, the second switch is turned off, and in the test mode, the first switch is turned off, the second switch is turned on.

14. A quality test method of display panel, comprising:
determining whether the display panel is in a test mode or a normal display mode;
if in the normal display mode, supplying a first control signal from a first control output terminal of a control circuit through a transfer element to a driving input terminal of a gate driving circuit, so that the gate driving circuit drives a switching element on the display panel to turn on according to a first timing;
if in the test mode, supplying a second control signal from a second control output terminal of the control circuit through the transfer element to the driving input terminal of the gate driving circuit, so that the gate driving circuit drives the switching element on the display panel to turn on according to a second timing;

wherein the proportion of the turning-on time of the switching element in the second timing is larger than that of the turning-on time of the switching element in the first timing; and wherein the transfer element is connected with the first control output terminal and the driving input terminal in the normal display mode and is connected with the second control output terminal and the driving input terminal in the test mode such that in the normal display mode, the transfer element receives the first control signal from the first control output terminal and feeds the first control signal to the driving input terminal; and in the test mode, the transfer element receives the second control signal from the second control output terminal and feeds the second control signal to the driving input terminal.

15. The quality test method as claimed in claim 14, wherein the display panel comprises multiple said switching elements arranged in an array, in the normal display mode, the gate driving circuit drives the switching elements to turn on by column or by row according to the first timing; in the test mode, the gate driving circuit drives all switching elements to turn off according to the second timing.

* * * * *